United States Patent
Chung

(10) Patent No.: US 11,442,079 B2
(45) Date of Patent: Sep. 13, 2022

(54) CONTACT DEVICE FOR ELECTRICAL TEST

(71) Applicant: ISC CO., LTD., Seongnam-si (KR)

(72) Inventor: Young Bae Chung, Seongnam-si (KR)

(73) Assignee: ISC CO., LTD., Seongnam-si (KR)

( * ) Notice: Subject to any disclaimer, the term of this patent is extended or adjusted under 35 U.S.C. 154(b) by 0 days.

(21) Appl. No.: 17/132,700

(22) Filed: Dec. 23, 2020

(65) Prior Publication Data
US 2021/0190823 A1  Jun. 24, 2021

(30) Foreign Application Priority Data

Dec. 24, 2019  (KR) .......... 10-2019-0174155

(51) Int. Cl.
*G01R 1/067*  (2006.01)
*G01R 1/04*  (2006.01)

(52) U.S. Cl.
CPC ....... *G01R 1/06755* (2013.01); *G01R 1/0408* (2013.01); *G01R 1/06722* (2013.01); *G01R 1/06738* (2013.01)

(58) Field of Classification Search
CPC ............ G01R 1/06755; G01R 1/06722; G01R 1/0408; G01R 1/06738
See application file for complete search history.

(56) References Cited

U.S. PATENT DOCUMENTS

| | | | | |
|---|---|---|---|---|
| 4,918,384 A | * | 4/1990 | Giringer | H01R 11/18 324/72.5 |
| 5,478,779 A | * | 12/1995 | Akram | G01R 1/06738 257/E21.575 |
| 6,028,436 A | * | 2/2000 | Akram | G01R 1/0408 324/754.03 |
| 2004/0239355 A1 | * | 12/2004 | Kazama | G01R 1/06722 324/755.05 |
| 2006/0006888 A1 | * | 1/2006 | Kruglick | G01R 1/06744 324/754.14 |
| 2006/0238209 A1 | * | 10/2006 | Chen | G01R 3/00 324/755.01 |
| 2013/0115722 A1 | | 5/2013 | Nakagawa et al. | |
| 2020/0124637 A1 | * | 4/2020 | Chung | G01R 1/06722 |

FOREIGN PATENT DOCUMENTS

| | | |
|---|---|---|
| KR | 10-1439342 B1 | 9/2014 |
| TW | 201346288 A | 11/2013 |
| TW | 201905467 A | 2/2019 |

OTHER PUBLICATIONS

Taiwan Patent Office; Application No. 109143333; Office Action dated Aug. 27, 2021.

* cited by examiner

*Primary Examiner* — Paresh Patel
(74) *Attorney, Agent, or Firm* — Fitch, Even, Tabin & Flannery LLP

(57) ABSTRACT

The disclosure includes a contact device for electrical test, the contact device for electrical test including a second body portion, a first body portion stacked above the second body portion, a middle portion stacked above the first body portion, and having a first protrusion that is sharp and has a first apex portion, the first protrusion being formed on an upper side of the middle portion, and the first body portion, the middle portion, and the contact portion are sequentially and upwardly stacked, the middle portion and the contact portion include materials different from each other, and a first protrusion is provided inside the second protrusion.

18 Claims, 14 Drawing Sheets

*PRIOR ART*

*PRIOR ART*

*PRIOR ART*

*PRIOR ART*

*PRIOR ART*

*PRIOR ART*

CONTACT DEVICE FOR ELECTRICAL TEST

CROSS-REFERENCE TO RELATED APPLICATION

This application is based on and claims priority under 35 U.S.C. § 119 to Korean Patent Application No. 10-2019-0174155, filed on Dec. 24, 2019, in the Korean Intellectual Property Office, the disclosure of which is incorporated by reference herein in its entirety.

BACKGROUND

1. Field

The disclosure relates to a contact device for electrical test for testing, and more particularly, to a probe device for testing, which may prevent a stack structure from being separated in a frequent contact process.

2. Description of Related Art

Semiconductor devices, after completion, undergo an electrical test to check a normal operation or reliability. A test device including a pad, and a test socket, are used for the electrical test.

A test socket connects a terminal of a semiconductor device and a pad of a test device, and thus the test socket enables exchange of electrical signals between the terminal of a semiconductor device and the test device.

To this end, as an electrical connection device, a pogo pin is provided in a test socket. A pogo pin may include a probe member and an elastic member, and may be used for numerous test sockets because the pogo pin may facilitate a contact between a semiconductor device and a test device and may buffer a mechanical shock that is generated during the contact.

FIG. 1 schematically illustrates a pogo pin 1100 according to the related art. In the pogo pin illustrated in FIG. 1, an upper plunger 1005 and a lower plunger 1006 are provided to protrude from both ends of a body 1004, and a spring 1007 is inserted in the inside of the body 1004. The upper plunger 1005 and the lower plunger 1006 are biased in directions in which the upper plunger 1005 and the lower plunger 1006 are away from each other by the spring 1007. In this state, the upper plunger 1005 contacts a terminal 1002 of a semiconductor device 1001, and the lower plunger 1006 contacts a pad 1009 of a test device 1008, so that the terminal 1002 of the semiconductor device 1001 and the pad 1009 of the test device 1008 are electrically connected to each other.

Korean Patent No. 10-1439342 discloses another pogo pin according to the related art. In detail, referring to FIGS. 2 and 3, a pogo pin may include a probe member 1110, a body 1120, an elastic member 1130 arranged in the body 1120 and biasing the probe member 1110 upwards, a lower probe member 1140 having at least a portion protruding through a lower opening of the body 1120 and supported by the elastic member 1130. Furthermore, in the probe member 1110, a plurality of probe plates 1112 to 1116 including probe portions 1112a to 1114a and coupling portions 1112b to 1114b are integrally attached to one another.

The pogo pin according to the related art have the following problems.

As the probe portion in direct contact with the terminal of a semiconductor device has a plate shape, a contact area with the terminal is limited.

Furthermore, although the probe portion requires high wear resistance to endure a concentrated load transferred from a semiconductor device, and the coupling portion requires high conductivity to compensate for a conductivity loss of the probe portion, as the probe portion according to the related art is stacked horizontally with respect to a contact portion, the probe portion and the coupling portion, which are formed of different materials, are difficult to exhibit unique electrical and mechanical characteristics according to the materials. In other words, the pogo pin according to the related art has a problem in that the pogo pin is weak in the wear resistance and conductivity required for the pogo pin.

Another probe device for testing according to related art is illustrated in FIGS. 4 to 6. The probe device 2000, 2001 for testing may include one or more contact portions 2010 having one end formed to be sharp and contacting a subject to be tested, a first body portion 2020, 2021 having one end, to which the other end of the contact portion 2010, 2011 is coupled, a first body portion 2020, 2021 having a polygonal or circular column shape, a second body portion 2030, 2031 having one end, to which the other end of the first body portion 2020, 2021 is coupled, and having a polygonal or circular column shape, and a third body portion 2040, 2041 having one end, to which the other end of the second body portion 2030, 2041 is coupled, and having a polygonal or circular column shape.

In this state, the first body portion 2020, 2021, the second body portion 2030. 2031, and the third body portion 2040, 2041 are stacked in a height direction with respect to the other end of the contact portion 2010, 2011.

In a probe device 2000, 2001 for testing according to the related art, as a contact portion 2010, 2011 and a body portion are stacked in a vertical direction with respect to the contact portion 2010, 2011 with a terminal, and the contact portion 2010, 2011 is formed of a material having high rigidity and the body portion is formed of a material having high conductivity, the efficiency and life of the probe member may be increased.

However, the probe member of FIGS. 4 to 6 has a problem that the contact portion 2010, 2011 and the first body portion 2020, 2021 are cross-sectionally separated from each other when a load having different directions or a constant direction is applied thereto. In other words, as a contact surface between the contact portion 2010, 2011 and the first body portion 2020, 2021 is configured to extend in a horizontal direction, when a load in the vertical or horizontal direction is applied thereto, the contact portion 2010, 2011 and the first body portion 2020, 2021 may be separated from each other on the contact surface therebetween, and thus the function of a probe member may be lost.

SUMMARY

To address the above problems, the disclosure provides a probe device for testing, in which no cross-sectional separation occurs on a contact surface even when a load is applied thereto in a certain direction.

Additional aspects will be set forth in part in the description which follows and, in part, will be apparent from the description, or may be learned by practice of the presented embodiments of the disclosure.

According to an aspect of the disclosure, a probe device for testing, which is used for a test socket as at least a part of the probe device for testing is inserted in an inner space formed in a pipe, includes a second body portion having a polygonal or circular column shape, a first body portion stacked above the second body portion, integrally formed with the second body portion, and having a polygonal or circular column shape, a middle portion stacked above the first body portion, integrally formed with the first body portion, and having a first protrusion that is sharp and has a first apex portion, the first protrusion being formed on an upper side of the middle portion, and a contact portion formed on an upper surface of the middle portion integrally with the middle portion and including a second protrusion, the second protrusion having a height increasing in a direction perpendicular to the upper surface of the middle portion along an appearance of the first protrusion, provided at a position corresponding to the first protrusion, and including a second apex portion formed therein, in which the second body portion, the first body portion, the middle portion, and the contact portion are sequentially and upwardly stacked, the middle portion and the contact portion include materials different from each other, and a first protrusion is provided inside the second protrusion.

In the probe device for testing, the first protrusion may have a first inclined surface that is inclined upwardly toward the first apex portion, and the second protrusion may have a second inclined surface that is inclined upwardly toward the second apex portion.

In the probe device for testing, the first inclined surface and the second inclined surface may be substantially parallel to each other.

In the probe device for testing, the second body portion, the first body portion, the middle portion, and the contact portion may be manufactured by a micro electro mechanical system (MEMS) process, in which a resist pattern is formed on a substrate and then the resist pattern is filled with a conductive material.

In the probe device for testing, the contact portion may include a material having higher rigidity than the middle portion.

In the probe device for testing, a Vickers rigidity of the contact portion may be 600 Hv or more.

In the probe device for testing, the contact portion may include a material having superior wear resistance to the middle portion.

In the probe device for testing, the contact portion may include an alloy material including a hardening element such as carbon, boron, or oxygen.

In the probe device for testing, the middle portion may have superior conductivity to the contact portion.

In the probe device for testing, the middle portion may include a material having a conductivity of 50% IACS or more.

In the probe device for testing, a thickness of the contact portion in a vertical direction may be 20 μm or more.

In the probe device for testing, a maximum outer diameter of the second protrusion and a maximum outer diameter of the first protrusion may be the same.

In the probe device for testing, the maximum outer diameter of the second protrusion may be greater than the maximum outer diameter of the first protrusion.

According to another aspect of the disclosure, a probe device for testing, which is used for a test socket as at least a part of the probe device for testing is inserted in an inner space formed in a pipe, includes a second body portion having a polygonal or circular column shape, a first body portion stacked above the second body portion, integrally formed with the second body portion, and having a polygonal or circular column shape, a middle portion stacked above the first body portion, integrally formed with the first body portion, and having a first protrusion that is sharp and has a first apex portion, the first protrusion being formed on an upper side of the middle portion, and a contact portion formed on an upper surface of the middle portion integrally with the middle portion and including a second protrusion, the second protrusion having a height increasing in a direction perpendicular to the upper surface of the middle portion along an appearance of the first protrusion, provided at a position corresponding to the first protrusion, and including a second apex portion formed therein, in which the second body portion, the first body portion, the middle portion, and the contact portion are manufactured by a micro electro mechanical system (MEMS) process, in which a resist pattern is formed on a substrate and then the resist pattern is filled with a conductive material, and a first protrusion is provided inside the second protrusion.

The probe device for testing may further include a third body portion provided below the second body portion, integrally formed with the second body portion, and having a polygonal or circular column shape.

In the probe device for testing, the second body portion may have an outer diameter less than the first body portion and the third body portion, and a recessed portion of the pipe may be fixedly formed on at least a part of an outer circumferential surface of the second body portion or an elastic member arranged in the inner space may be fixedly provided in at least a part of the second body portion.

The probe device for testing may further include a fourth body portion having one end to which another end of the third body portion is coupled and having a polygonal or circular column shape.

In the probe device for testing, each of the first protrusion and the second protrusion may include a plurality of protrusions.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
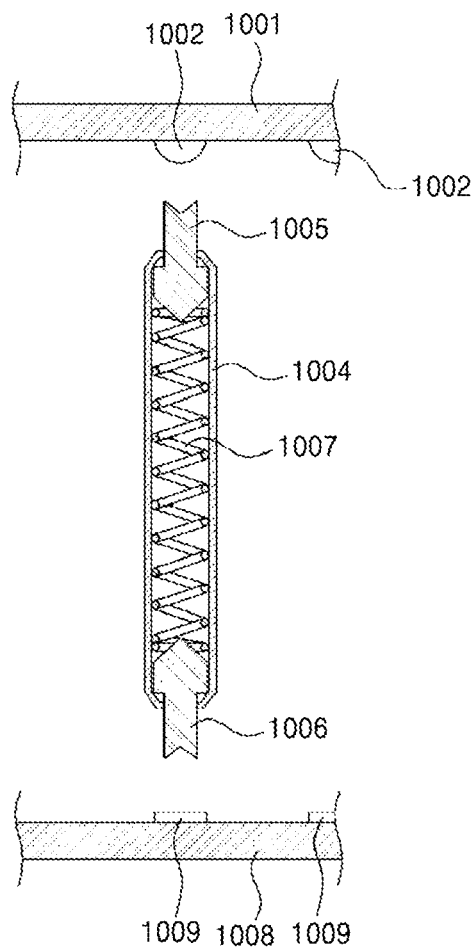
FIG. 1 is a schematic view of a pogo pin according to the related art.
Figure 2:
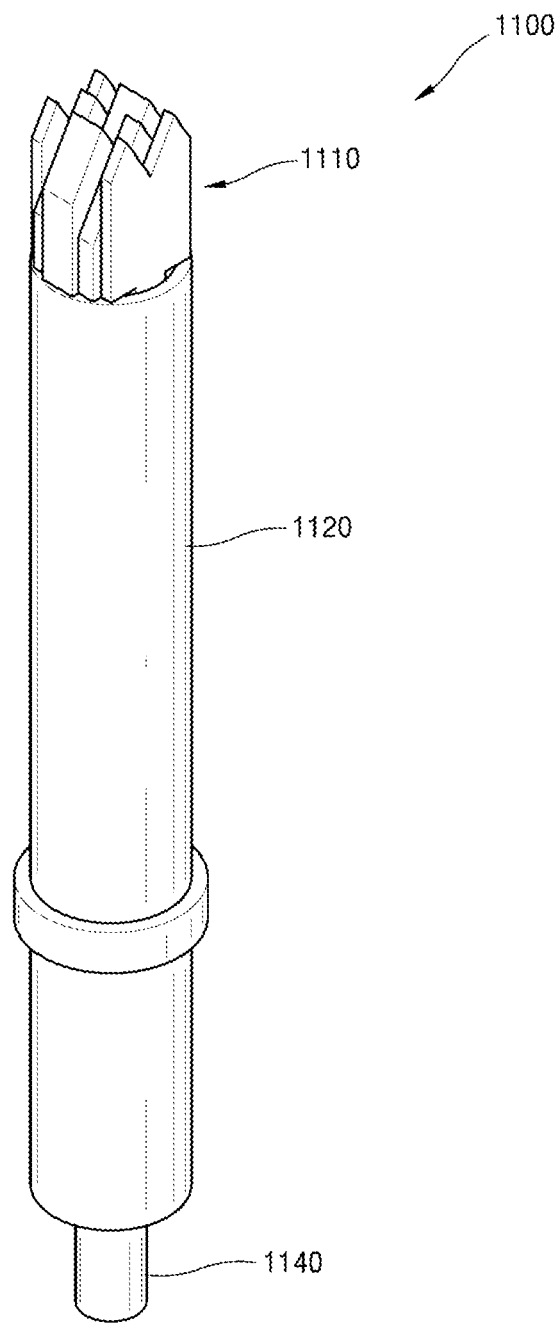
FIG. 2 is a perspective view of another pogo pin according to the related art.
Figure 3:
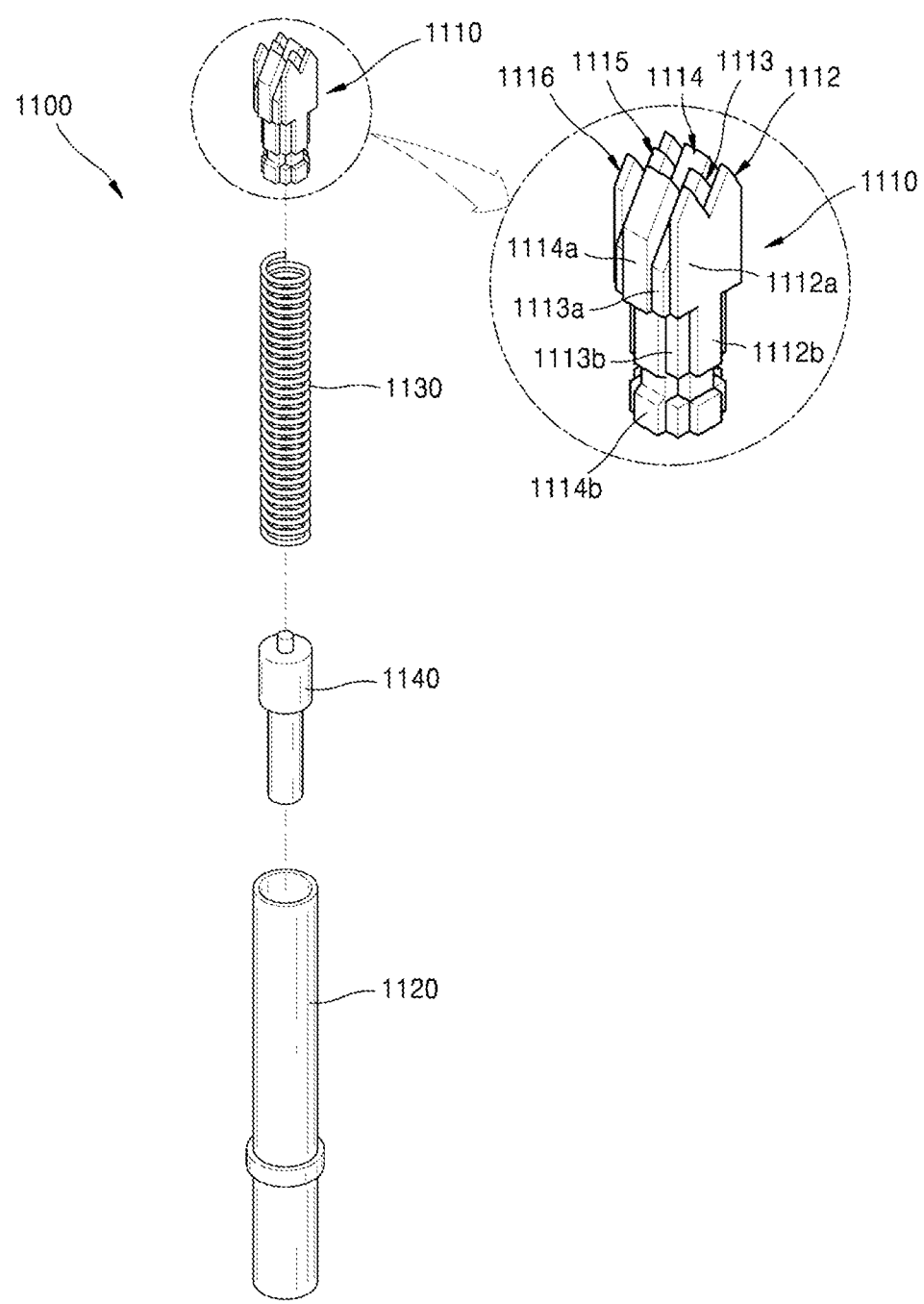
FIG. 3 is an exploded perspective view of the pogo pin according to the related art of FIG. 2.
Figure 4:
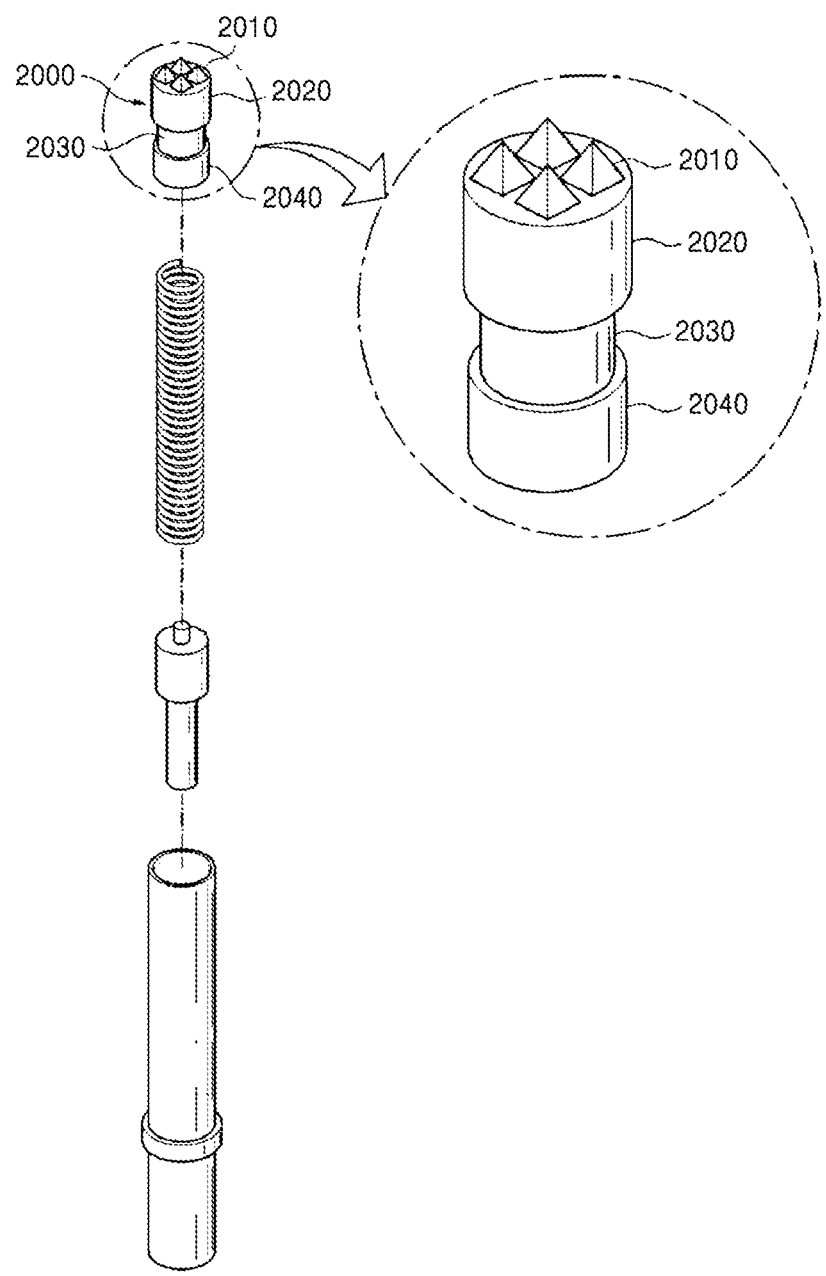
FIG. 4 is a schematic view of another pogo pin according to the related art.
Figure 5:
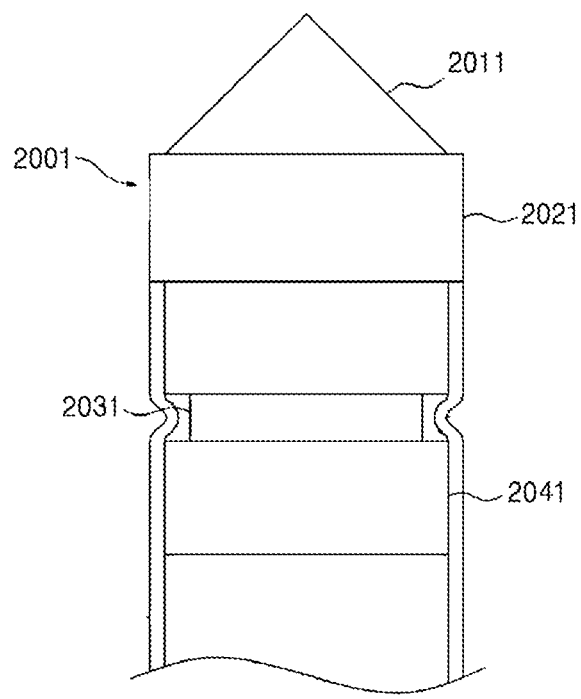
FIG. 5 is a side view of a probe device of FIG. 4.
Figure 6:
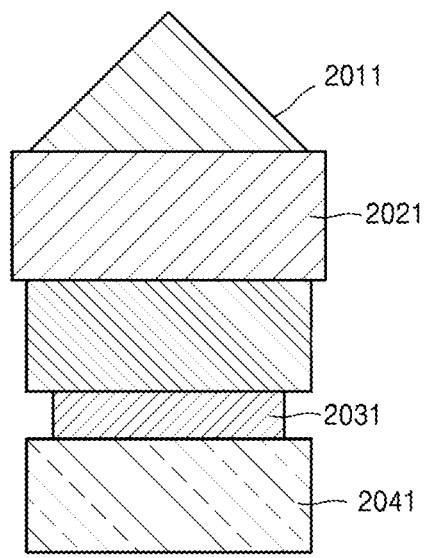
FIG. 6 is a cross-sectional view of the probe device of FIG. 5.
Figure 7:
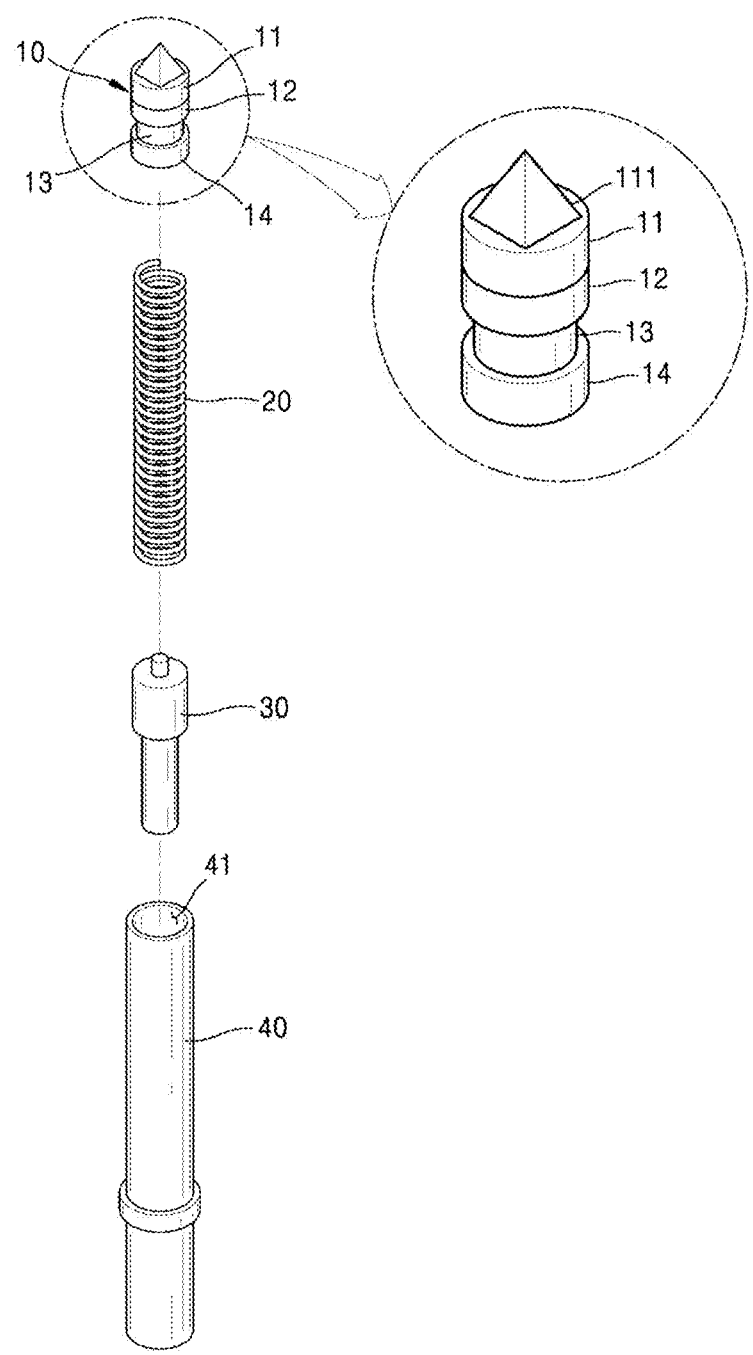
FIG. 7 is a perspective view of a pogo pin including a probe device for testing according to an embodiment of the disclosure.
Figure 8:
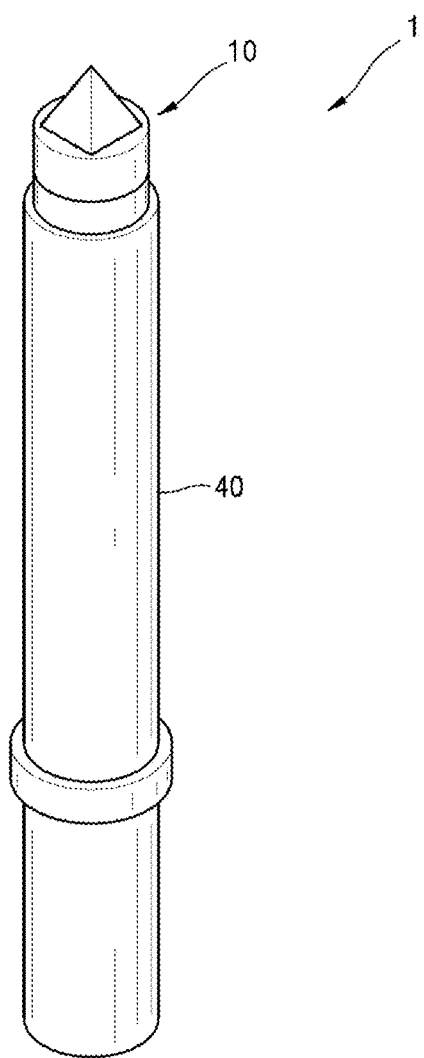
FIG. 8 is an assembled perspective view of FIG. 7.
Figure 9:
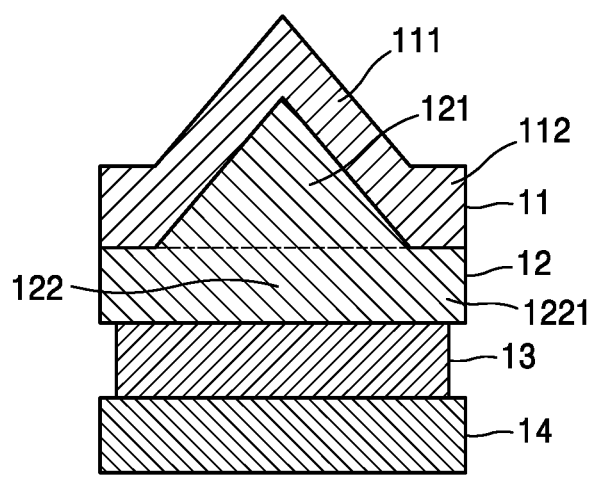
FIG. 9 is a cross-sectional view of the probe device for testing of FIG. 7.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

In the following description, the disclosure is described with reference to the accompanying drawings. However, the disclosure may be implemented in various forms, and accordingly, the disclosure is not limited to the embodiments described below. In the drawings, a part that is not related to a description is omitted to clearly describe the disclosure and, throughout the specification, similar parts are referenced with similar reference numerals.

In the specification, when a constituent element "connects" or is "connected" to another constituent element, the constituent element contacts or is connected to the other constituent element directly or through at least one of other constituent elements. Terms such as "include" or "comprise" may not be construed to necessarily include any and all constituent elements or steps described in the specification, but may be construed to exclude some of the constituent elements or steps or further include additional constituent elements or steps.

The terminology used herein is for the purpose of describing particular embodiments only and is not intended to limit embodiments. An expression used in a singular form in the specification also includes the expression in its plural form unless clearly specified otherwise in context. In the specification, terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

The embodiment of the disclosure is described below in detail with reference to the accompanying drawings.

A pogo pin 1 is provided in a test socket (not shown), as a constituent element connecting a semiconductor device (not shown) to a test device (not shown), and thus a pipe 20 of the pogo pin 1 that is described later may be coupled to the test socket.

The pogo pin 1 including a probe device 10 for testing (hereinafter, referred to as the probe member) may include a pipe 40 having a polygonal or circular column shape, in which an inner space 41 is formed in a lengthwise direction to accommodate the probe member 10 and openings are formed in one end and the other end thereof to communicate with the inner spacer 40, the probe member 10 having at least a part arranged in the inner space 41 of the pipe 40 and the other part protruding to the outside through the opening at the one end thereof, a plunger 30 having at least a part arranged in the inner space 41 of the pipe 40 and the other part protruding to the outside through the opening at the other end thereof, and an elastic member 20 arranged in the inner space 41 of the pipe 40 and biasing the probe member 10 or the plunger 30 to the outside.

In this state, the pipe 40 forms a basic appearance of the pogo pin 1, which may be called a barrel or housing, and the inner space 41 may be formed in the form of a cylinder.

The probe member 10 is used to test the electrical characteristics of a semiconductor device, and has at least a part inserted into the inner space 41 of the pipe 40 and the other part protruding through the opening at the one end to the outside and contacting a terminal of the semiconductor device B.

The probe member 10 may include a second body portion 14, a first body portion 13, a middle portion 12, and a contact portion 11.

The second body portion 14 may have a polygonal or circular column shape. The size of a cross-section of the second body portion 14 is less than or equal to the size of a cross-section of the inner space 41, and thus the second body portion 14 may be inserted into the inner space 41. When the size of a cross-section of the second body portion 14 is equal to the size of a cross-section of the inner space 41, the first body portion 13 may be inserted into and coupled to the inner space 41.

The first body portion 13 is stacked above the second body portion 14, integrally formed with the second body portion 14, and has a polygonal or circular column shape. In detail, the size of a cross-section of the first body portion 13 may be less than the size of cross-sections of the middle portion 12, the second body portion 14, and the inner space 41. In this case, a recessed portion is formed by pressing one region of the pipe 40 corresponding to the first body portion 13, and thus the probe member 10 may be fixed to the pipe 40 by the recessed portion.

The middle portion 12 is stacked above the first body portion 13, integrally formed with the first body portion 13. The middle portion 12 comprises a middle plate 122 and a first protrusion 121. The middle plate 122 has a polygonal or circular plate shape. The first protrusion 121 is sharp and has a first apex portion. The first protrusion is formed on an upper side of the middle plate 122. The middle plate 122 and a first protrusion 121 are formed integrally. The middle portion 12 having a column structure is formed such that the first protrusion 121 having a cone shape is integrally formed at a center of an upper surface of the middle portion 12. The first protrusion 121 is configured to be inserted in the inside of a second protrusion 111 of the contact portion 11.

In this state, when the top apex portion of the first protrusion 121 is assumed to be a first apex portion, the first protrusion 121 is provided with a first inclined surface that is inclined upwardly toward the first apex portion. The first inclined surface that is inclined forms a contact surface with an inner surface of the contact portion 11.

The middle portion 12 may include a material having superior conductivity compared with the contact portion 11, for example, a material, such as gold, silver, copper, and the like, having a conductivity of 50% IACS or more, or an alloy including the materials and having an overall conductivity of 50% IACS or more.

The middle portion 12 is manufactured to substantially protrude upward and to be stacked below an inner portion of the second protrusion 111 of the contact portion 11 contacting the terminal of a semiconductor device. The middle portion 12 may include a material that has less stress in electrodeposit and is capable of maintaining electrical conductivity. Accordingly, compared with a manufacturing method according to the related art, even when a load in different directions or a certain direction is applied, mechanical characteristics and wear resistance are excellent due to a buffering operation from controlled compression and deformation of constituent elements.

The contact portion 11 is formed on the upper surface of the middle portion 12 integrally with the middle portion 12. The contact portion 11 comprises a hollow rim portion 112 and a second protrusion 111. The hollow rim portion 112 connects a rim of the middle plate 122 and extends upward from a rim 1221 of the middle plate 122. The second protrusion 111 extends from an inner circumferential surface of the hollow rim portion 112 and connects the hollow rim portion 112. The hollow rim portion 112 and the second protrusion 111 are formed integrally. The second protrusion 111 has a height increasing in a direction perpendicular to the upper surface of the middle portion 12 along the appearance of the first protrusion 121 is provided at a position corresponding to the first protrusion 121. A second apex portion is formed at the top portion of the second protrusion 111, and the second protrusion 111 has a height increasing in a direction perpendicular to the upper surface of the middle portion 12 in a direction closer to the second apex portion.

In detail, the contact portion 11, which is a portion directly contacting the terminal of a semiconductor device, is configured such that the second apex portion that is the top apex of the second protrusion 111 contacts the terminal.

The first protrusion 121 is inserted in the second protrusion 111 of the contact portion 11 such that an inclined inner surface of the second protrusion 111 contacts an inclined outer surface of the first protrusion 121, in an inclined state.

In other words, the inner surface of the contact portion 11 and the outer surface of the middle portion 12 are configured to have a contact surface in an inclined state. The contact portion 11 and the middle portion 12 may include materials different from each other. In detail, the contact portion 11 may include a material having high rigidity and superior wear resistance compared with the middle portion 12, and the middle portion 12 may include a material having superior conductivity compared with the contact portion 11. Accordingly, in a frequent contact process, abrasion and damage of the contact portion 11 may be prevented and electrical connection performance may become superior.

The second protrusion 111 of the contact portion 11 has a second inclined surface that is inclined upwardly toward the second apex portion, the first inclined surface of the first protrusion 121 and the second inclined surface of the second protrusion 111 may be substantially parallel to each other.

Figure 10:
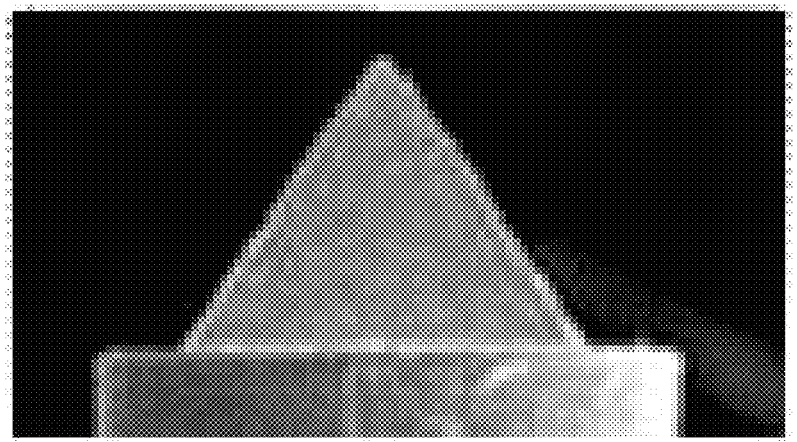
FIG. 10 is an image of a probe device for testing according to an embodiment of the disclosure.
Figure 11:
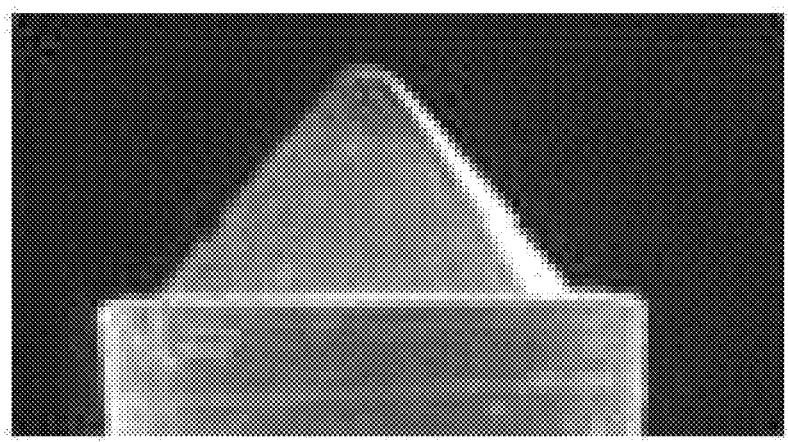
FIG. 11 is an image of a probe device for testing with a contact portion after repeated tests.

In detail, a material forming the contact portion 11 may include an alloy of hardening elements, such as carbon, boron, oxygen, and the like, capable of improving wear resistance, or a material layer in which Vickers hardness of a raw material is 600 Hv or more or less, and the thickness of the greatest outer diameter of the contact portion 11 may be 20 μm. When the thickness of the contact portion 11 is less than 20 μm, the contact portion 11 may be abraded to be removed when the contact portion 11 frequently contacts the terminal of a device to be tested. In detail, FIG. 10 shows a probe device for testing in an initial state. In general, for electrical tests, the life of a probe device for testing required in the market may be over 1000 K. After using a probe device for testing 1000 K under the test conditions of rigidity of 900 Hv and using Ni—C as a material, it may be seen that the probe device for testing is abraded by about 18 μm as shown in FIG. 11. Accordingly, in order for the contact portion 11 to remain even after repeated tests of 1000K or more, the minimum thickness of the contact portion 11 is required to be 20 μm or more.

The maximum outer diameter of the second protrusion 111 of the contact portion 11 and the maximum outer diameter of the first protrusion 121 of the middle portion 12 may be the same. The reason is that, when the maximum outer diameter of the second protrusion 111 and the maximum outer diameter of the first protrusion 121 of the middle portion 12 are the same, inclined contact surface between the second protrusion 111 and the first protrusion 121 increases, and thus a separation phenomenon due to an external force may be reduced.

A method of manufacturing a probe device for testing according to the disclosure is described below.

The probe device for testing according to the disclosure is manufactured by sequentially and upwardly stacking the second body portion 14, the first body portion 13, the middle portion 12, and the contact portion 11, each of which is manufactured by a micro electro mechanical system (MEMS) process in which a resist pattern is formed on a substrate and then the resist pattern is filled with a conductive material. As such, as the probe device for testing is manufactured by the MEMS process, a desired shape may be precisely and freely configured.

As such, the probe device manufactured through the MEMS process may be manufactured to have a multistage structure, and thus the probe device may be easily coupled to a pipe or an elastic member due to the multistage structure. When the contact portion 11 is formed and a plurality of body portions are formed by the MEMS process using a dry film and a sacrificial substrate, the dry film is entirely removed and the probe device manufactured from the sacrificial substrate is separated therefrom, thereby completing a manufacturing process.

According to the manufacturing method of the disclosure, as a desired shape is precisely manufactured through the substrate and film, reliability of testing after manufacturing may be improved.

The probe device for testing according to the disclosure is not limited to the above-described embodiment and may be modified as follows.

First, although the above-described embodiment shows an example in which the first body portion and the second body portion only are stacked under the middle portion, the disclosure is not limited thereto, and the third body portion may be additionally arranged.

Figure 12:
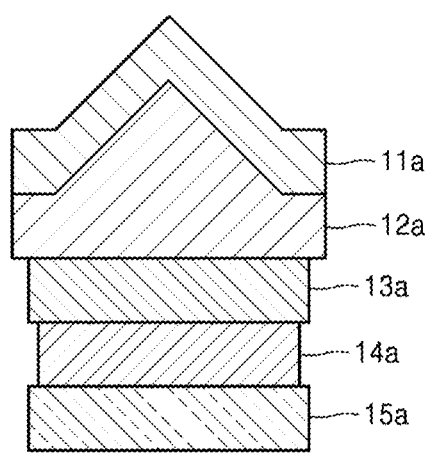
FIG. 12 is a cross-sectional view of a probe device for testing according to another embodiment.

In detail, as illustrated in FIG. 12, a first body portion 13a, a second body portion 14a, and a third body portion 15a may be integrally manufactured under a contact portion 11a and a middle portion 12a.

In this state, as the second body portion 14a is formed to have an outer diameter compared with the first body portion 13a and the third body portion 15a, the second body portion 14a may be fixed by recessing an upper end of a pipe to the pipe.

Figure 13:
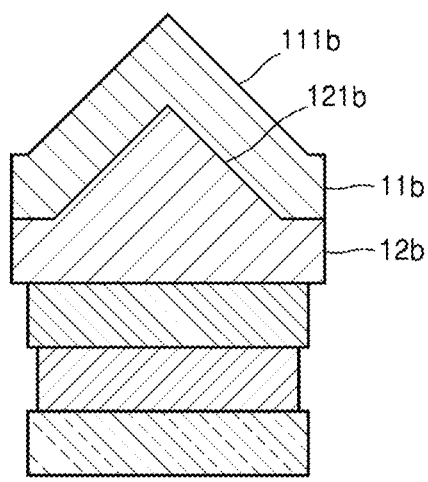
FIG. 13 is a cross-sectional view of a probe device for testing according to another embodiment.

Furthermore, although the above-described embodiment described an example in which the maximum outer diameter of the second protrusion of the contact portion and the maximum outer diameter of the first protrusion of the middle portion are the same, as illustrated in FIG. 13, the maximum outer diameter of a second protrusion 111b of a contact portion 11b may be greater than the maximum outer diameter of a first protrusion 121b of a middle portion 12b. In this state, the thickness of the contact portion 11b may be generally uniform.

Figure 14:
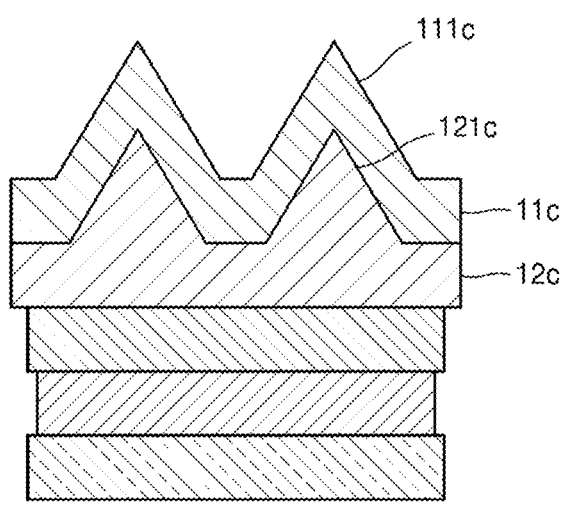
FIG. 14 is a cross-sectional view of a probe device for testing according to another embodiment.

Furthermore, although the above-described embodiment shows an example in which each of the first protrusion and the second protrusion is individually formed, the disclosure is not limited thereto, and as illustrated in FIG. 14, each of a first protrusion 121c and a second protrusion 111c may include a plurality of protrusions. In other words, the second protrusion 111c of a contact portion 11c may include a plurality of protrusions, and the first protrusion 121c of a middle portion 12c may include a plurality of protrusions which are inserted in a plurality of the second protrusion 111c of the contact portion 11c. The disclosure is not limited thereto, and the number of the first protrusions of the middle portion may be less than the number of the second protrusions of the contact portion. In other words, the first protrusion is not formed in some of a plurality of the second protrusions, and in this case, durability of the second protrusions may be excellent so that damage to the second protrusions when contacting the terminal of a semiconductor device may be reduced. Consequently, it may be possible that the second protrusion into which the first protrusion is inserted and the second protrusion having superior rigidity and wear resistance without the first protrusion being inserted therein are arranged to be mixed with each other. In this case, as the height of the second protrusion having superior rigidity and wear resistance increases further, a function of piercing a coated layer adhering on a semiconductor device may be possibly performed.

In the probe device for testing according to the disclosure, as the first protrusion of the middle portion is inserted into the second protrusion of the contact portion, and the contact surface of the middle portion of the contact portion is inclined, even when a load in different directions or a certain direction is applied, the separation phenomenon of the contact portion from the contact region of the middle portion may not occur.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A contact device for electrical test, which is used for a test socket as at least a part of the contact device for testing is inserted in an inner space formed in a pipe, the contact device for testing comprising:
   a second body portion having a polygonal or circular column shape and including conductive material;
   a first body portion stacked above the second body portion, integrally formed with the second body portion, and having a polygonal or circular column shape, and including conductive material;
   a middle portion stacked above the first body portion, integrally formed with the first body portion, and comprising a middle plate having a polygonal or circular plate shape and a first protrusion that is sharp and has a first apex portion, the first protrusion being formed on an upper side of the middle plate; and
   a contact portion formed on an upper surface of the middle portion integrally with the middle portion and comprising a hollow rim portion which connects to a rim of the middle plate and a second protrusion which extends from an inner circumferential surface of the hollow rim portion, the second protrusion having a height increasing in a direction perpendicular to the upper surface of the middle portion along an appearance of the first protrusion, provided at a position corresponding to the first protrusion, and comprising a second apex portion formed therein,
   wherein the middle plate and the first protrusion are formed integrally, and the hollow rim portion and the second protrusion are formed integrally,
   wherein the second body portion, the first body portion, the middle portion, and the contact portion are sequentially and upwardly stacked,
   the middle portion and the contact portion comprise materials different from each other, and
   the first protrusion is provided inside the second protrusion.

2. The contact device for electrical test of claim 1, wherein the first protrusion has a first inclined surface that is inclined upwardly toward the first apex portion, and the second protrusion has a second inclined surface that is inclined upwardly toward the second apex portion.

3. The contact device for electrical test of claim 2, wherein the first inclined surface and the second inclined surface are substantially parallel to each other.

4. The contact device for electrical test of claim 1, wherein the second body portion, the first body portion, the middle portion, and the contact portion are manufactured by a micro electro mechanical system (MEMS) process, in which a resist pattern is formed on a substrate and then the resist pattern is filled with a conductive material.

5. The contact device for electrical test of claim 1, wherein the contact portion comprises a material having higher rigidity than the middle portion.

6. The contact device for electrical test of claim 5, wherein a Vickers hardness of the contact portion is 600 Hv or more.

7. The contact device for electrical test of claim 1, wherein the contact portion comprises a material having superior wear resistance to the middle portion.

8. The contact device for electrical test of claim 7, wherein the contact portion comprises an alloy material comprising a hardening element of carbon, boron, or oxygen.

9. The contact device for electrical test of claim 1, wherein the middle portion has superior conductivity to the contact portion.

10. The contact device for electrical test of claim 9, wherein the middle portion comprises a material having a conductivity of 50% IACS or more.

11. The contact device for electrical test of claim 1, wherein a thickness of the contact portion in a vertical direction is 20 μm or more.

12. The contact device for electrical test of claim 1, wherein a maximum outer diameter of the second protrusion and a maximum outer diameter of the first protrusion are same.

13. The contact device for electrical test of claim 1, wherein a maximum outer diameter of the second protrusion is greater than a maximum outer diameter of the first protrusion.

14. A contact device for electrical test, which is used for a test socket as at least a part of the contact device for electrical test is inserted in an inner space formed in a pipe, the contact device for electrical test comprising:
- a second body portion having a polygonal or circular column shape and including conductive material;
- a first body portion stacked above the second body portion, integrally formed with the second body portion, and having a polygonal or circular column shape, and including conductive material;
- a middle portion stacked above the first body portion, integrally formed with the first body portion, and comprising a middle plate having a polygonal or circular plate shape and a first protrusion that is sharp and has a first apex portion, the first protrusion being formed on an upper side of the middle plate; and
- a contact portion formed on an upper surface of the middle portion integrally with the middle portion and comprising a hollow rim portion which connects to a rim of the middle plate and a second protrusion which extends from an inner circumferential surface of the hollow rim portion, the second protrusion having a height increasing in a direction perpendicular to the upper surface of the middle portion along an appearance of the first protrusion, provided at a position corresponding to the first protrusion, and comprising a second apex portion formed therein, wherein the middle plate and the first protrusion are formed integrally, and the hollow rim portion and the second protrusion are formed integrally, wherein the second body portion, the first body portion, the middle portion, and the contact portion are manufactured by a micro electro mechanical system (MEMS) process, in which a resist pattern is formed on a substrate and then the resist pattern is filled with a conductive material, and the first protrusion is provided inside the second protrusion.

15. The contact device for electrical test of claim 14, further comprising a third body portion provided below the second body portion, integrally formed with the second body portion, and having a polygonal or circular column shape.

16. The contact device for electrical test of claim 15, wherein
- the second body portion has an outer diameter less than the first body portion and the third body portion, and
- a recessed portion of the pipe is fixedly formed on at least a part of an outer circumferential surface of the second body portion or an elastic member arranged in the inner space is fixedly provided in at least a part of the second body portion.

17. The contact device for electrical test of claim 15, further comprising a fourth body portion having one end to which another end of the third body portion is coupled and having a polygonal or circular column shape.

18. The contact device for electrical test of claim 14, wherein each of the first protrusion and the second protrusion comprises a plurality of protrusions.

* * * * *